United States Patent [19]

Crotti et al.

[11] Patent Number: 4,966,867
[45] Date of Patent: Oct. 30, 1990

[54] PROCESS FOR FORMING SELF-ALIGNED, METAL-SEMICONDUCTOR CONTACTS IN INTEGRATED MISFET STRUCTURES

[75] Inventors: Pier L. Crotti, Landriano; Nadia Iazzi, Cremona, both of Italy

[73] Assignee: SGS-Thomson Microelectrics s.r.l., Italy

[21] Appl. No.: 424,446

[22] Filed: Oct. 20, 1989

[30] Foreign Application Priority Data

Oct. 20, 1988 [IT] Italy .............................. 83674 A/88

[51] Int. Cl.⁵ ........................................... H01L 21/70
[52] U.S. Cl. .................................... 437/195; 437/228; 437/235
[58] Field of Search ...................... 437/40, 41, 52, 192, 437/195, 193, 228, 235

[56] References Cited

U.S. PATENT DOCUMENTS

| | | | |
|---|---|---|---|
| 4,057,895 | 11/1977 | Ghezzo | 437/228 |
| 4,319,954 | 3/1982 | White et al. | 437/228 |
| 4,508,815 | 4/1985 | Ackmann et al. | 437/228 |
| 4,518,629 | 5/1985 | Jeach | 437/228 |
| 4,523,372 | 6/1985 | Balda et al. | 437/228 |
| 4,536,949 | 8/1985 | Takayama et al. | 437/228 |
| 4,545,852 | 10/1985 | Barton | 437/228 |

FOREIGN PATENT DOCUMENTS

0260639 11/1986 Japan .
0248145 10/1988 Japan .

*Primary Examiner*—Brian E. Hearn
*Assistant Examiner*—T. Thomas

*Attorney, Agent, or Firm*—Pollock, Vande Sande & Priddy

[57] ABSTRACT

A process for forming self-aligned metal-semiconductor contacts in integrated MISFET devices determining during a phase of the fabrication the presence on the surface of a wafer of parallel gate lines of polycrystalline silicon provided with lateral "spacers", is founded on the formation of a dielectric oxide layer of a differentiated thickness, having a reduced thickness on the bottom of the valley between two adjacent gate lines wherein the contacts must be formed. The method comprises conformably depositing a first layer of dielectric silicon oxide, a second layer of precursor polycrystalline silicon and a third layer of nitride, followed by depositing a layer of planarization SOG. By blanket etching the SOG layer and the nitride layer, the crests of the precursor polycrystalline silicon layer are exposed. A residual layer of nitride is left inside the valley between adjacent gate lines. The precursor layer of polycrystalline silicon is thermally converted in the areas unmasked by the residual nitride into a dielectric silicon oxide and the removal from the bottom of valleys of the residual nitride and of the residual precursor polycrystalline silicon leaves the front of the wafer covered by a dielectric layer having the desired differentiated thickness, i.e. thinn (corresponding to the thickness of the first conformably deposited oxide layer) on the bottom of valleys between gate lines. By means of a noncritical mask the "length" of the self-aligned contacts is defined and the layer of dielectric is etched until exposing the semiconductor in contact areas along the bottom of the valleys between two adjacent parallel gate lines.

1 Claim, 3 Drawing Sheets

PROCESS FOR FORMING SELF-ALIGNED, METAL-SEMICONDUCTOR CONTACTS IN INTEGRATED MISFET STRUCTURES

BACKGROUND OF THE INVENTION

1. Field of the invention

The present invention relates to a process for forming self-aligned metal-semiconductor ohmic contacts in integrated circuits and more in particular in integrated MISFET structures.

2. Description of the prior art

The problem of electrically connecting the drain (and source) of MISFET structures (or more commonly of MOS transistors) to the respective metal tracks in integrated circuits becomes increasingly critical with the reduction of the sizes of these integrated structures.

With decreasing dimensions, the lithographic difficulties relative to the definition of micrometric windows through the masking resist and to the correct alignment of the mask and the processing difficulties relative to ensuring a good step coverage of the deposited metal within minuscule holes through the thickness of a dielectric layer increase.

Lately several new techniques have been proposed for overcoming these technological problems and for making contacts of sub-micrometric size, necessary for fabricating VLSI and ULSI integrated devices, namely: improved techniques for tapering the holes for more easily achieving a good step coverage by the metal, improved lithographic techniques for enhancing the definition of areas with both dimensions smaller than one micrometer, often associated with special techniques for pre-fillinq the holes by means of metal plugs.

Generally a definite drawback of the known techniques is represented by the fact that the masking of the contacts remains a highly critical step requiring adequate levels of precision.

OBJECTIVE AND SUMMARY OF THE INVENTION

A main objective of the present invention is to provide a new process for making substantially self-aligned metal-semiconductor contacts in MISFET type integrated structures.

Basically the novel process of the invention consists in obtaining a purposely differentiated thickness of an insulating layer of a dielectric oxide for isolating the gate lines previously formed on the surface of the wafer being fabricated so that the thickness of the insulating dielectric layer is purposely made smaller on the bottom of valleys of the dielectric layer coinciding with the area of the underlying semiconductor substrate to be contacted confined between two adjacent parallel gate lines than the thickness of the same dielectric layer over crests thereof coinciding with the tops of said gate lines. At this point a noncritical masking operation is sufficient for defining the "length" of the substantially self-aligned contacts to be formed and the layer of dielectric material is etched until exposing the surface of the underlying semiconductor substrate through the bottom (made relatively thinner in purpose) of the valleys of the layer which valleys are themselves self-aligned between adjacent parallel gate lines (i.e. parallel crests).

In respect to the conventional techniques for photolithographically defining the area of the contacts, the present invention permit to eliminate the problems relative to those critical photolithographic procedures which at present constitute a limitation to the reduction of the contacts size.

As notably intrinsic to self-alignment techniques for making micrometric and sub-micrometric features, the novel process of the invention offers the technological conditions for increasing the degree of integration of MISFET type structures because it overcomes the critical alignment tolerance requisite of a conventional "contacts" mask.

BRIEF DESCRIPTION OF THE DRAWINGS

These and other aspects and advantages of the invention will become evident through the following description of a preferred embodiment and the annexed drawings, wherein.

DESCRIPTION OF THE PREFERRED EMBODIMENT

A partial schematic cross-section of a device (wafer) containing MISFET structures being fabricated is depicted in the series of figures.

Typically on the surface of a monocrystalline semiconductor substrate 1, commonly cf silicon, conducting parallel gate lines or first level metal tracks are formed. Commonly this first level metal or gate lines are made of polycrystalline silicon heavily doped for increasing electrical conductivity and are insulated from the silicon substrate 1 by a dielectric gate layer 4, commonly made of silicon dioxide obtained by thermally oxidizing the surface of the silicon in an environment free of contaminants and containing steam. The first level metal tracks or gate lines are normally provided with lateral tapered spacers 5 and 6 of a dielectric material, commonly a silicon oxide chemically deposited from a vapor phase and successively plasma etched in a manner suitable to leave such tapered residues along the flanks of the gate lines 2 and 3 of polycrystalline silicon.

At this point of a standard fabrication process for this type of integrated devices, the process of the invention for forming the contacts comprises the following steps.

Figure 1:
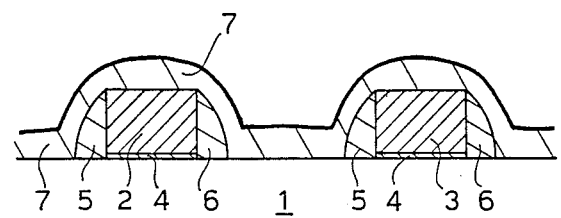
FIGS. 1 to 9 depict an essential sequence of steps of the process of the invention.

(a) Conformably depositing a layer 7 of a first dielectric oxide, preferably a silicon oxide deposited by a low temperature chemical vapor deposition, with a thickness comprised preferably between 1,000 and 3,000 Angstroms over the entire surface of the wafer being fabricated, as depicted in FIG. 1.

Figure 2:
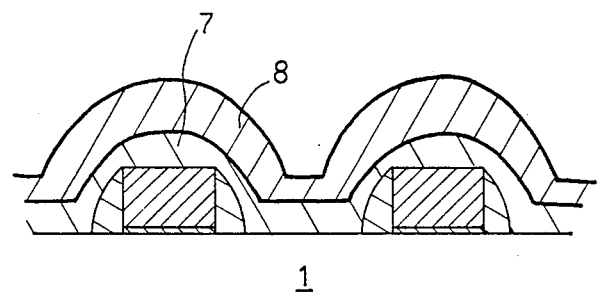

(b) Conformably depositing a second layer 8 of the polycrystalline precursor metallic material which may be converted by thermal oxidation into a dielectric oxide substanitally similar to the dielectric oxide of said first layer 7. By similar oxide it is intended that the precursor semiconductor material is converted into an essentially dielectric oxide crystallographically isomorphous with the oxide which constitutes the underlying first layer 7. Preferably such a polycrystalline precursor material is polycrystalline silicon conformably deposited by chemical vapor deposition with a thickness comprised preferably between 1,000 and 3,000 Angstroms, as depicted in FIG. 2.

Figure 3:
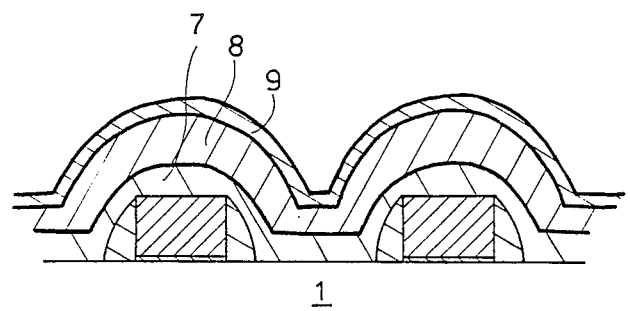

(c) Conformably depositing a third layer 9 of an oxidation resistant mater al, preferably silicon nitride deposited by low pressure chemical vapor deposition, having a thickness comprised preferably between 300 and 600 Angstroms, as depicted in FIG. 3.

Figure 4:
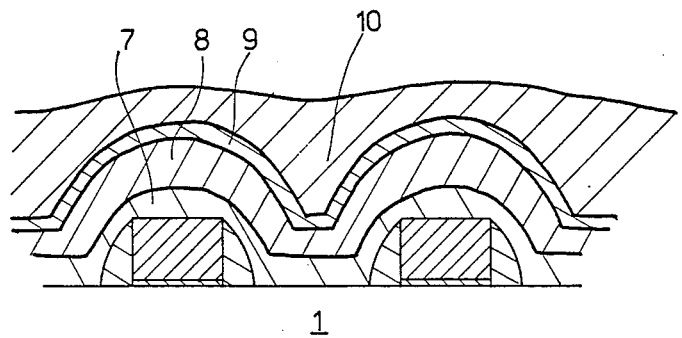

(d) Depositing a layer 10 of a planarization material, e.g. a spun-on-glass of silicon oxide (SOG). The thickness of the SOG layer 1 on the bottom of valleys may in practice be of about 6,000 Angstroms, while the thickness of the same SOG layer on peaks may be of about 2,000 to 3,000 Angstroms, as depicted in FIG. 4.

Figure 5:
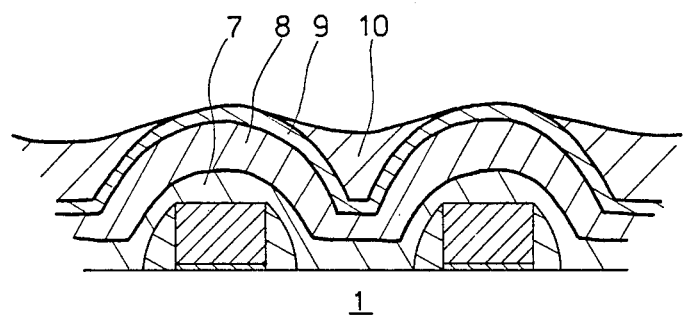
Figure 6:
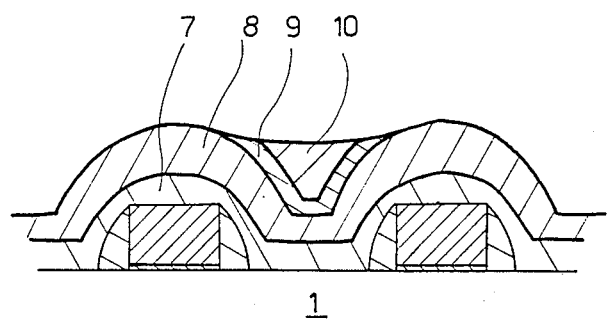
Figure 7:
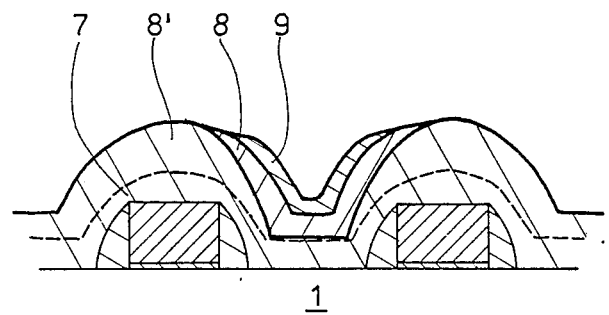

(e) "Blanket" etching the layer of planarization material (SOG) 10 and successively the exposed silicon nitride layer 9, as sequentially depicted in FIGS. 5 and 6. This etching may be carried out in a plasma or in a RIE plasma according to techniques well known to the skilled technician. Residues of the oxidation resistant material (nitride) 9 and of the planarization material (SOG) 10 are left on the bottom of valleys of the conformably deposited layers 7 and 8 between two adjacent gate lines 2 and 3. The residue of planarization material (SOG) 10 may then be selectively removed leaving only the residue of nitride 9 covering the valleys, as depicted in FIGS. 6 and 7.

(f) Thermally oxidizing until converting the polycrystalline silicon layer 8 in the areas exposed to the oxidizing environment unmasked by the residual nitride layer 9 into a layer of a dielectric oxide 8' substantially similar to the underlying layer of dielectric oxide 7 previously formed. As depicted in FIG. 7, the polycrystalline silicon 8 is converted into an oxide of silicon 8' with the exclusion of the zones within the valleys where the polycrystalline silicon 8 remains protected from oxidation by a masking residual silicon nitride layer 9.

(g) Plasma etching the residues of nitride 9 and the polycrystalline silicon 8 left on the bottom of valleys until removing them completely in order to leave the front of the wafer being fabricated desirably covered by a layer of dielectric oxide the thickness of which corresponds substantially to the sum of the thickness of the first conformably deposited layer 7 and of the converted oxide layer 8' obtained by thermally converting the originally deposited layer of polycrystalline silicon 8 with the exclusion of the bottom of valleys between adjacent gate lines where the thickness of the dielectric oxide layer remains substantially unchanged and equal to the thickness of the conformably deposited layer of dielectric oxide 7 originally deposited on the front of the wafer.

Figure 8:
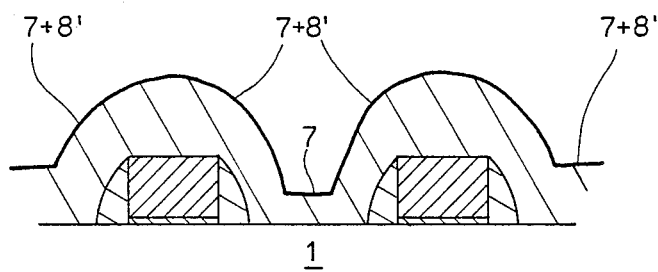
Figure 9:
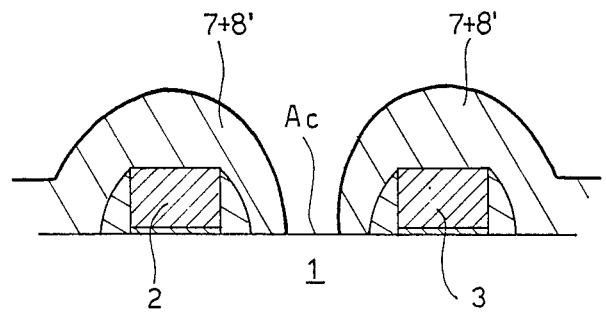

(h) RIE or plasma etching the dielectric oxide layer until exposing the underlying monocrystalline silicon 1 in contact areas Ac between two adjacent gate lines, as depicted in FIG. 9. Naturally a noncritical mask will be used for defining the areas where the contact must be formed along the bottom of the valley of the dielectric layer (7+8' of FIG. 8), the bottom portion of which has suitably a reduced thickness and is therefore readily "opened" by the etching of the dielectric. In other words, a noncritical mask serves solely to define the "length" of the contact area on the silicon substrate within an active area comprised between two adjacent gate lines.

The "opening" of contacts is therefore essentially self-aligned in respect to adjacent gate lines 2 and 3 and the aperture assumes an advantageous tapered form which favors a correct filling of the contact hole by a second level metal which may conventionally be deposited by sputtering.

We claim:

1. A process for forming self-aligned metal-semiconductor contacts in integrated MISFET structures which determine, during a phase of the fabrication process, a superficial morphology of a monocrystalline semiconductor material wafer being fabricate characterized by the presence of parallel gate lines of a first metallic material provided with tapered lateral spacers of a dielectric material, said contacts with the monocrystalline semiconductor being formed in areas comprised between two adjacent parallel gate lines, comprising:
   (a) conformably depositing a first layer of a first dielectric oxide on the surface of the wafer being fabricated having said gate lines thereon;
   (b) conformably depositing a second layer of a precursor polycrystalline metallic material capable of being converted by oxidation in an oxide substantially similar to said first dielectric oxide;
   (c) conformably depositing a third layer of an oxidation resistant material;
   (d) depositing a layer of a planarization material;
   (e) blanket etching said layer of planarization material and said third conformably deposited layer of oxidation resistant material until exposing crests of said second conformably deposited precursor metallic material layer overlaying said gate lines and leaving residues of said planarization material and of said third conformably deposited layer of oxidation resistant material on the bottom of valleys comprised between two adjacent gate lines;
   (f) selectively etching said residues of planarization material removing them completely from said valleys;
   (g) thermally oxidizing said precursor polycrystalline metallic material until converting the entire thickness thereof in areas unmasked from oxidation by said residue of said third conformably deposited layer of oxidation resistant material covering said valleys into a dielectric oxide similar to said first dielectric oxide of said first conformably deposited layer:
   (h) selectively etching said residue of oxidation resistant material and unconverted residues of said precursor metallic material, respectively of said third and of said second conformably deposited layers, until removing said residues from said valleys;
   (i) masking the areas which are not destined to the formation of said contacts;
   (l) etching the dielectric oxide layer of disuniform thickness until exposing the surface of said monocrystalline semiconductor material in unmasked zones of the bottom of said valleys where the thickness of said dielectric oxide layer corresponds to the thickness of said first conformably deposited layer not incremented in thickness by the conversion into a similar dielectric oxide of said second conformably deposited precursor metallic layer as in zones out of said valleys;
   the formation of said metal-semiconductor contacts being completed by depositing a metal through etched apertures of said dielectric layer along the bottom of said valleys between two adjacent gate lines.

* * * * *